(12) United States Patent
Aiura et al.

(10) Patent No.: US 6,788,234 B2
(45) Date of Patent: Sep. 7, 2004

(54) METHOD OF SELECTING CELLS FOR INPUT CODE IN A DIGITAL-TO-ANALOG CONVERTER

(75) Inventors: Masami Aiura, Sendai (JP); Satoshi Takahashi, Sendai (JP); Yuichi Nakatani, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/359,503

(22) Filed: Feb. 5, 2003

(65) Prior Publication Data

US 2003/0169194 A1 Sep. 11, 2003

(30) Foreign Application Priority Data

Mar. 5, 2002 (JP) ........................................ 2002-059353

(51) Int. Cl.[7] ................................................. H03M 1/66
(52) U.S. Cl. ........................ 341/144; 341/136; 341/153
(58) Field of Search ................................ 341/144, 136, 341/153

(56) References Cited

U.S. PATENT DOCUMENTS

| | | | | |
|---|---|---|---|---|
| 5,949,362 A | * | 9/1999 | Tesch et al. ................ | 341/144 |
| 5,995,031 A | * | 11/1999 | Okuda et al. ............... | 341/144 |
| 6,061,010 A | * | 5/2000 | Adams et al. .............. | 341/144 |
| 6,072,415 A | * | 6/2000 | Cheng ........................ | 341/144 |
| 6,225,929 B1 | * | 5/2001 | Beck .......................... | 341/144 |
| 6,320,527 B1 | * | 11/2001 | Dedic et al. ................ | 341/144 |
| 6,329,940 B1 | * | 12/2001 | Dedic ......................... | 341/144 |
| 6,339,391 B1 | * | 1/2002 | Chung et al. ............... | 341/153 |
| 6,340,939 B1 | * | 1/2002 | Dedic ......................... | 341/136 |

\* cited by examiner

*Primary Examiner*—Jean Bruner Jeanglaude
(74) *Attorney, Agent, or Firm*—Charles E. Bergere

(57) ABSTRACT

A method for selecting cells in response to input codes of a digital-to-analog converter distributes noise based on cyclicality of selection patterns to reduce its value, without being dependent upon the input codes. A 6-bit current output type digital-to-analog converter has 63 current source cells $C01$ through $C63$. A prime number of, or 61, current source cells are used as cyclically selected cells. That is, 61 current source cells $C02$–$C62$, ranging from the second left-most current source cell $C02$ to the second right-most current source cell $C62$, are used as cyclically selected cells. The remaining left-most current source cell $C01$ and right-most current source cell $C63$ are used as non-cyclically selected cells. The cyclically selected cells, including the 61 current source cells, are selected in response to input codes using a Data Weighted Average (DWA) technique.

4 Claims, 4 Drawing Sheets

| IN=1 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| IN=1 | 1 | 2 | 3 | 4 | 5 | 6 | 7 | 8 | 9 | 10 | 11 | 12 | 13 | 14 | 15 |
| IN=1 | 1 | 2 | 3 | 4 | 5 | 6 | 7 | 8 | 9 | 10 | 11 | 12 | 13 | 14 | 15 |
| IN=2 | 1 | 2 | 3 | 4 | 5 | 6 | 7 | 8 | 9 | 10 | 11 | 12 | 13 | 14 | 15 |
| IN=1 | 1 | 2 | 3 | 4 | 5 | 6 | 7 | 8 | 9 | 10 | 11 | 12 | 13 | 14 | 15 |
| IN=4 | 1 | 2 | 3 | 4 | 5 | 6 | 7 | 8 | 9 | 10 | 11 | 12 | 13 | 14 | 15 |
| IN=8 | 1 | 2 | 3 | 4 | 5 | 6 | 7 | 8 | 9 | 10 | 11 | 12 | 13 | 14 | 15 |
| IN=6 | 1 | 2 | 3 | 4 | 5 | 6 | 7 | 8 | 9 | 10 | 11 | 12 | 13 | 14 | 15 |
| IN=1 | 1 | 2 | 3 | 4 | 5 | 6 | 7 | 8 | 9 | 10 | 11 | 12 | 13 | 14 | 15 |
| IN=10 | 1 | 2 | 3 | 4 | 5 | 6 | 7 | 8 | 9 | 10 | 11 | 12 | 13 | 14 | 15 |
| IN=3 | 1 | 2 | 3 | 4 | 5 | 6 | 7 | 8 | 9 | 10 | 11 | 12 | 13 | 14 | 15 |

*FIG. 4*
—PRIOR ART—

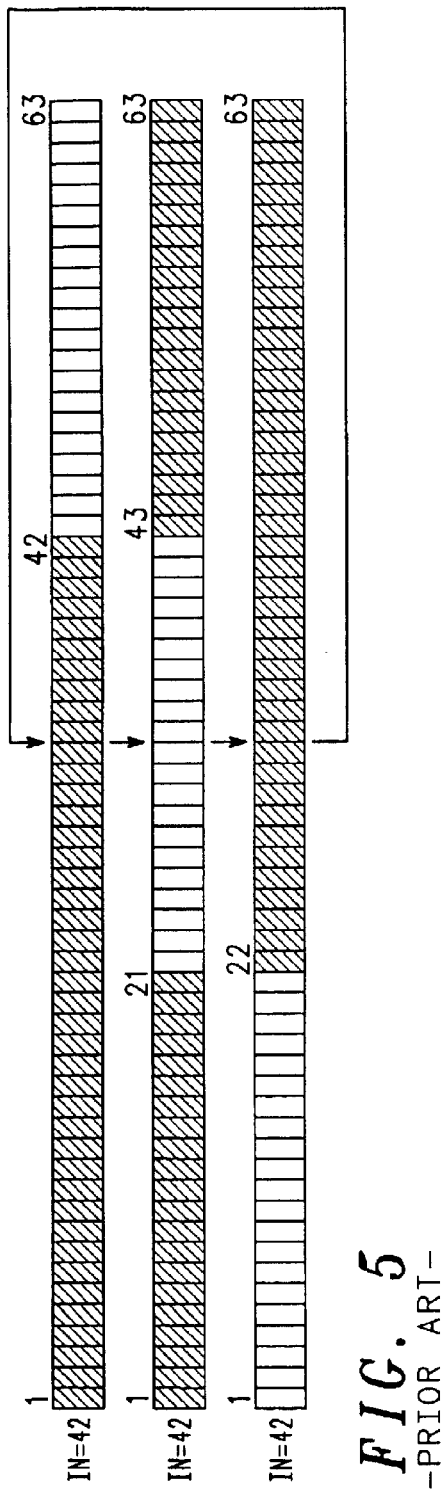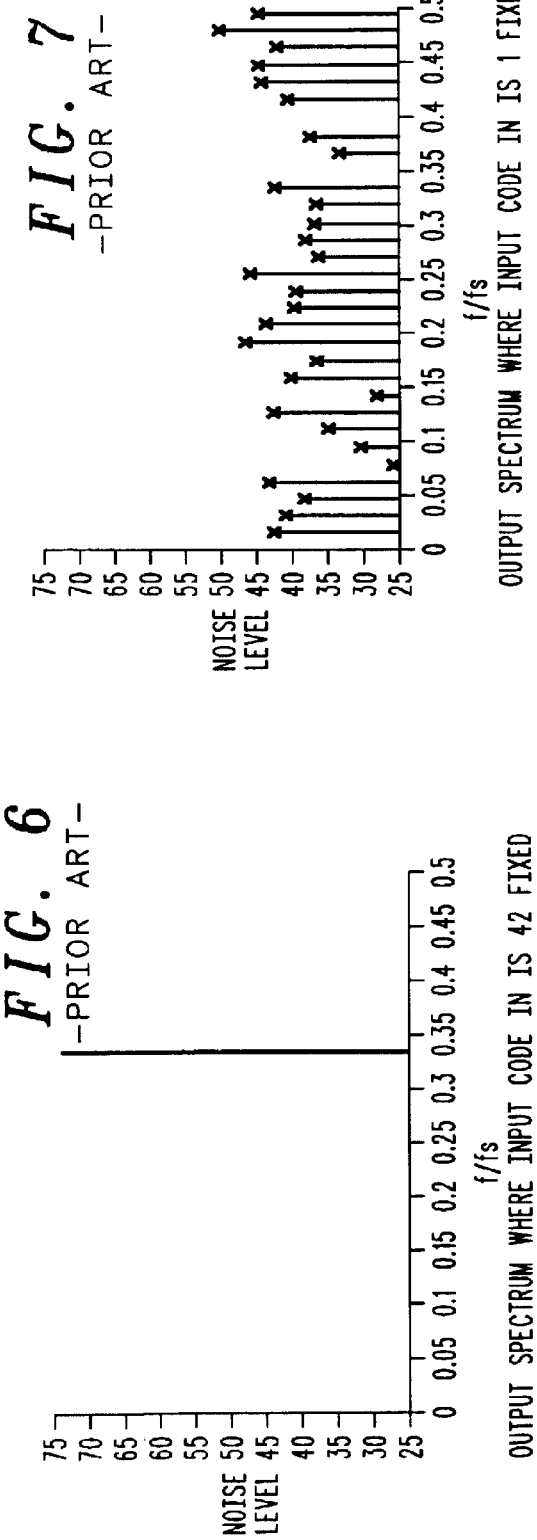

METHOD OF SELECTING CELLS FOR INPUT CODE IN A DIGITAL-TO-ANALOG CONVERTER

BACKGROUND OF THE INVENTION

The present invention relates to a method for selecting cells in response to input codes of a digital-to-analog converter.

FIG. 3 shows one example of a 4-bit current output type digital-to-analog converter. In FIG. 3, the current output type digital-to-analog converter provides current source cells 1–15 as fifteen output cells. Each of the current source cells 1–15 is connected to either of a first analog output line L1 or a second analog output line L2 as a changeover switch SW disposed respectively is selectively operated in accordance with digital data. In other words, when a predetermined number of current source cells are selected in response to input codes (digital data), the changeover switches SW for the selected current source cells are switched. This causes the output currents from the selected current source cells to be output via the changeover switches SW to the second analog output line L2, respectively.

The current output type digital-to-analog converter is formed on a semiconductor chip, and the respective current source cells are also formed on the chip. Thus, during the manufacturing process, it is difficult to manufacture all the current source cells formed on the chip with the same degree of precision. That is, there are some limitations, in terms of the manufacturing process, for outputting the same output currents for all the current source cells.

In this way, it is difficult to output the same output current from all the current source cells; as such, if current source cells to be selected in response to the input code are determined univocally, analog values relative to digital values do not become linear. Thus, a DWA (Data Weighted Averaging) technique has been proposed as a method for selecting current source cells in response to the input code.

The DWA technique is briefly described with reference to FIG. 4. FIG. 4 shows a 4-bit current output type digital-to-analog converter having fifteen current source cells 1–15 shown in FIG. 3, where the respective current source cells 1–15 are represented by square boxes. It should be appreciated that current source cells selected are shaded with slant lines. In FIG. 4, when the input code "in" is "1"->"1"->"2"->"1"->"4"->"8"->"6"->"1"->"10"->"3", it indicates a transition of the current source cells selected.

As is clear from FIG. 4, with the DWA technique, current source cells based on a new input code "in" are sequentially selected from current source cells subsequent to the last of the current source cells selected by its immediately preceding input code "in". That is, with the DWA technique, every current source cell has the same probability of being selected by dynamically changing the current source cells to be selected in response to the input code "in" whenever they are output. As a result, if the input code "in" is constant, the probability that each current source cell is selected is identical; as such, the average for that output attains such a value that errors due to manufacturing variations among the current source cells are offset each other.

The afore-described DWA technique has been only adopted in digital-to-analog converters with high oversampling rates, such as 16 and 32. That is, the DWA technique has not ever been applied to digital-to-analog converters with oversampling rates as low as 2 or 4, or to Nyquist-rate digital-to-analog converters.

If the DWA technique were employed in a Nyquistrate digital-to-analog converter or the like, the following problem would occur. FIG. 5 shows one example of transitions of current source cells selected by the DWA technique in a 6-bit current output type digital-to-analog converter having 63 current source cells.

Now assume that "42" input codes "in". have been inputted consecutively, as shown in FIG. 5. With the DWA technique, three combinations of current source cell selections are repeated. That is, there are three patterns in FIG. 5: one where the respective current source cells of 1st through 42nd counted from left are selected, as shown in the top portion; one where the respective current source cells of 43rd through 63rd and 1st through 21st are selected, as shown in the middle portion; and one where the respective current source cells of 22nd through 63rd are selected, as shown in the bottom portion.

The output current It (=It1) where the 1st through 42nd current source cells are selected in the top portion is "Is+α1"; the output current It (=It2) where the 43rd through 63rd and 1st through 21st current source cells are selected in the middle portion is "Is+α2"; and the output current It (=It3) where the 22nd through 63rd current source cells are selected in bottom portion is "Is+α3". It should be appreciated that Is represents the value of the current that should be output when there are no manufacturing variations. α1, α2, and α3 denote error currents for the respective selection patterns based on manufacturing variations for each current source cell.

Thus, if the "42" input codes "in" are continuous, the output current It in response to the "42" input codes "in" changes from "Is+α1" to "Is+α2" to "Is +α3", according to the DWA technique. This change involves noise components concentrated at a position of ⅓ the sampling frequency, as shown in FIG. 6. It should be appreciated that "fs" in FIG. 6 denotes the sampling frequency.

Incidentally, FIG. 7 shows the noise spectrum where "1" input code "in" is inputted consecutively; because there are 63 patterns, it can be found that noise is distributed over many frequencies and its value is small.

Accordingly, the smaller the number of repetitive selection patterns (the number of selection patterns required to cycle back), the more difficult it is to average the output currents of the respective current source cells due to manufacturing variations, so that digital-to-analog conversion with high accuracy cannot be expected. A so-called partial DWA technique, where some of the entire current source cells are used to perform the DWA technique, also has a similar problem.

With the afore-described digital-to-analog converter having a high oversampling rate, it was possible to average such a fluctuating output current through a filter circuit. However, with said Nyquist-rate digital-to-analog converter or the like, because sampling is performed near the Nyquist frequency, the filtering circuit that filters noise components at ⅓ the sampling frequency cannot be used, so that averaging cannot be done. Additionally, with a conventional high-sampling-rate digital-to-analog converter, significant noise as shown in FIG. 6 should also be eliminated through a filter circuit; as a result, it is necessary to set stringent noise attenuation characteristics required for the filter circuit, leading to complication of filter circuitry.

The present invention is intended to solve the afore-described problem, and has as its objective to provide a method for selecting cells in response to input codes of a digital-to-analog converter, which allows for reduction of noise based on cyclicality of selection patterns, without being dependent upon the input codes.

SUMMARY OF THE INVENTION

One embodiment of the present invention relates to a method for selecting cells in response to input codes of a digital-to-analog converter, wherein when output cells are selected from multiple output cells in response to an input code, output cells based on a new input code are selected from output cells subsequent to the last of the output cells selected by its immediately preceding input code, so that an analog signal is derived from said output cells selected, said method characterized by: the number of said multiple output cells being comprised of a prime number.

Another embodiment of the invention relates to a method for selecting cells in response to input codes of a digital-to-analog converter, wherein: said multiple output cells are classified into cyclically selected cells where output cells based on a new input code are sequentially selected from output cells subsequent to the end of the output cells selected by its immediately preceding input code, and non-cyclically selected cells that are univocally selected in response to a predetermined input code, and wherein the number of said cyclically selected cells is a prime number.

Another embodiment of the invention relates to a method for selecting cells in response to input codes of a digital-to-analog converter wherein: the number of said cyclically selected cells is the greatest prime number among prime numbers equal to or smaller than the number of all output cells.

According to at least one embodiment of the invention because the number of output cells is a prime number, the number of selection patterns required until the selection pattern for selected current output cells cycles back to the same selection pattern is a prime number regardless of the codes inputted, even if input codes of the same value continue.

Thus, even if input codes of the same value continue regardless of codes inputted, the noise based on cyclicality of selection patterns is distributed and its value is reduced, and analog values due to manufacturing variations of output cells can be averaged, thereby allowing for digital-to-analog conversion with a high degree of accuracy.

Additionally, multiple output cells are classified into cyclically selected cells only for a prime number of output cells and non-cyclically selected cells for the rest of the output cells. For those cyclically selected cells, output cells based on a new input code are sequentially selected from output cells subsequent to the last of the output cells selected by its immediately preceding input code. Thus, various embodiments are realized by just slightly modifying an existing digital-to-analog converter without the need for designing a new digital-to-analog converter.

Furthermore, because the number of cyclically selected cells is comprised of the greatest prime number among prime numbers equal to or smaller than the number of all output cells, the number of selection patterns required to cycle back to the same selection pattern can be maximized, and the noise can be distributed over many frequencies and its value can be reduced, thereby allowing the output current due to manufacturing variations among current source cells to be averaged.

BRIEF DESCRIPTION OF THE DRAWINGS

FIG. 4 is an explanatory diagram for explaining a DWA (Data Weighted Averaging) technique as a prior art method of selecting current source cells for input code of a digital-to-analog converter.

FIG. 5 is a diagram for explaining transitions of current source cells selected by the DWA technique in a 6-bit current output type digital-to-analog converter having 63 current source cells.

FIG. 6 is a chart for explaining the noise contained in the output current where there are a small number of cyclic patterns for the input code.

FIG. 7 is a chart for explaining the noise contained in the output current where there are a large number of cyclic patterns for the input code.

DETAILED DESCRIPTION OF THE INVENTION

A method for selecting cells in response to input codes of a digital-to-analog converter according to the present invention is described below with reference to FIGS. 1 and 2, which describe one embodiment of the present invention that is embodied in a current output type digital-to-analog converter having 63 current source cells.

Figure 1:
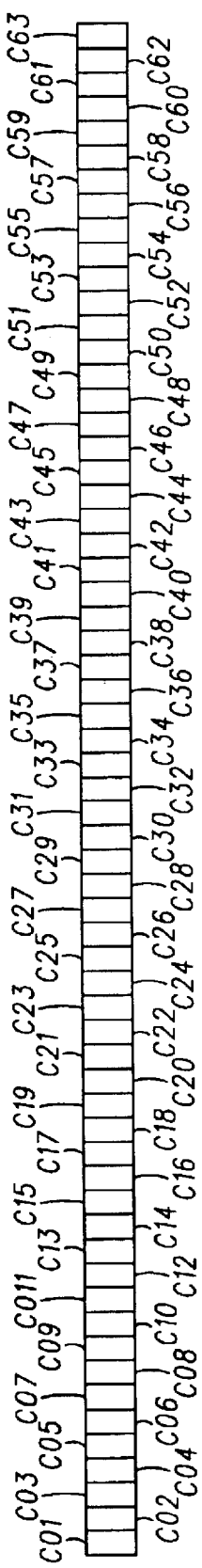
FIG. 1 is a schematic diagram of cells for a 6-bit current output type digital-to-analog converter that embodies the present invention.
Figure 3:
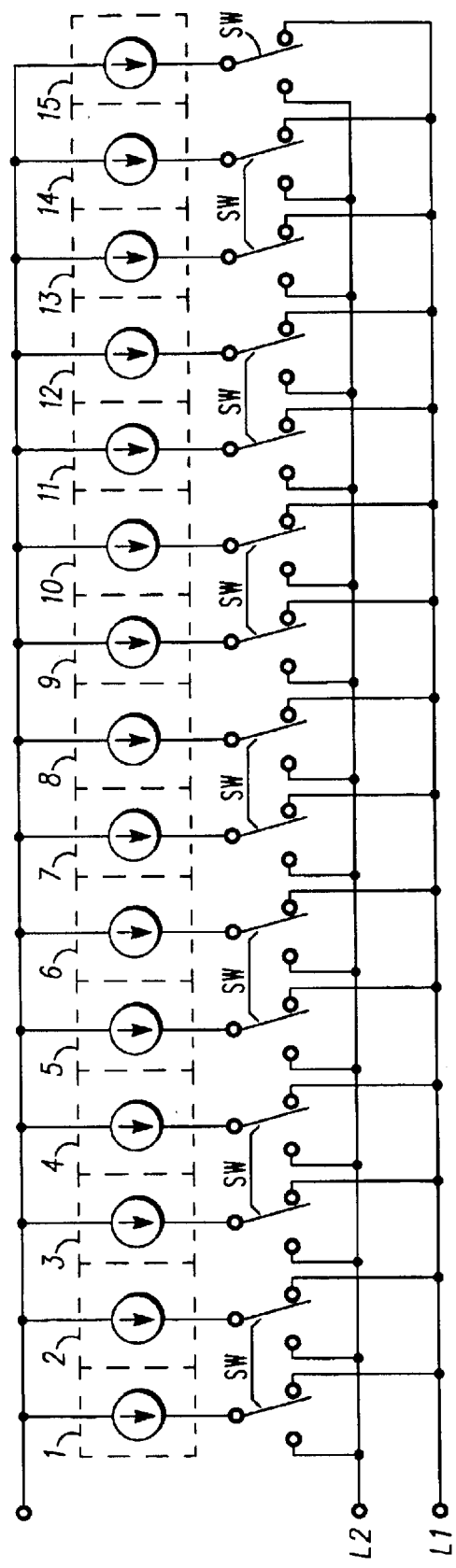
FIG. 3 is a circuit diagram for explaining a 4-bit current output type digital-to-analog converter.

FIG. 1 shows a schematic diagram of cells of a 6-bit current output type digital-to-analog converter having current source cells as 63 output cells, where 63 current source cells C01–C63 are represented by square boxes. In FIG. 2, boxes shaded with slant lines denote current source cells selected in response to an input code "in".

Now, determine cyclically selected cells and noncyclically selected cells among the 63 current source cells C01–C63. The cyclically selected cells are current source cells to be selected according to the afore-described DWA technique, and assigned a prime number of current source cells. With the present embodiment, 61 current source cells are used as cyclically selected cells; that is, 61 current source cells C02–C62, ranging from the second left-most current source cell C02 to the second right-most current cell C62, are used as cyclically selected cells.

The non-cyclically selected cells are current source cells that are univocally selected in response to a predetermined input code "in" without complying with the afore-described DWA technique, and are assigned the number of entire current source cells less the number of said cyclically selected cells. Thus, according to the present embodiment, two (=63–61) current source cells are used as non-cyclically selected cells; that is, the left-most current source cell C01 and the right-most current source cell C64 are used as non-cyclically selected cells.

The left-most current source cell C01, as a noncyclically selected cell, is always selected when the input code "in" is equal to or greater than "1". In other words, when the input code "in" is "1", only the current source cell C01 is always selected. Furthermore, the right-most current source cell C64, as a non-cyclically selected cell, is always selected only when the input code "in" is "64". In other words, when the input code "in" is "0" through "63", the current source cell C64 is always unselected.

Thus, when the input code "in" is "2" through "63", the left-most current source cell C01 is selected, and the remaining current source cells are selected from said cyclically selected cells, or current source cells C02 through C62. For example, the input code "in" is "5", five current source cells are selected. Because the current source cell C01 is always selected, the remaining four current source cells are selected from the cyclically selected cells, or 61 current source cells C02–C62. Incidentally, when the input code is "10", nine current source cells are selected from the cyclically selected cells, or 61 current source cells C02–C62.

The method for selecting the cyclically selected cells, or 61 current source cells C02–C62, in response to an input code "in" provides selection according to the DWA technique. For the 61 current source cells C02–C62, current source cells based on a new input code "in" are sequentially selected from current source cells subsequent to the last of the current source cells selected by its immediately preceding input code "in". Assume, for example, that the last cell of the current source cells selected by the immediately preceding input code "in" is the fifth left-most current source cell C05. If a subsequent new input code "in" is "7", then the current source cell C01 (non-cyclically selected cell), and six current source cells C06 through C01, counted from the sixth left-most current source cell C06, are selected.

Figure 2:
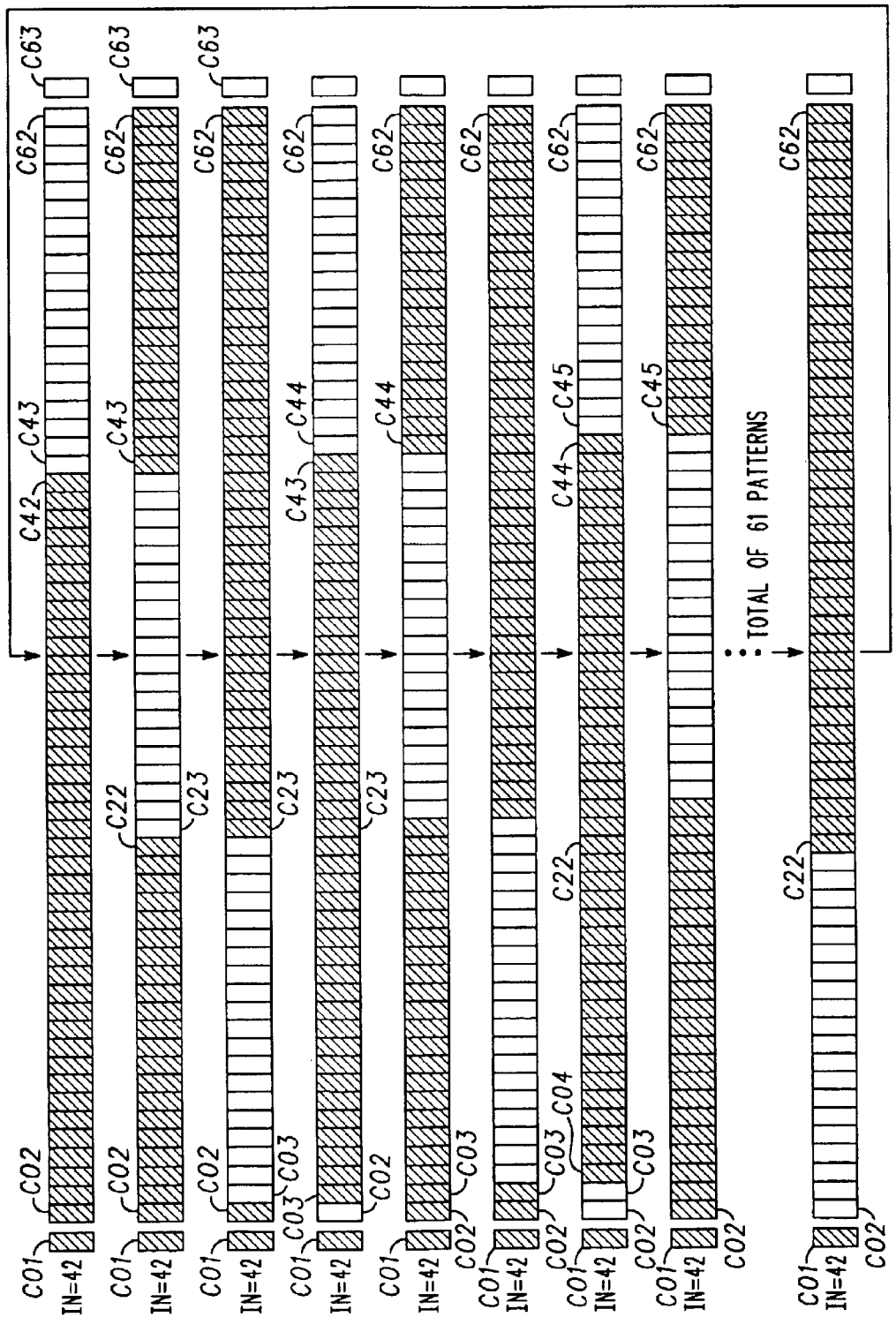
FIG. 2 is an explanatory diagram for explaining transitions of current source cells selected when an identical input code is inputted consecutively.

Furthermore, if an input code "in" of "42" is inputted consecutively, as shown in FIG. 2, for example, 41 current source cells are selected from the cyclically selected cells, or 61 current source cells C02–C62, and those 41 current source cells selected cycle. Then, the cyclically selected cells are comprised of a prime number of, or 61, current source cells C02–C62; as such, if an input code "in" of "42" is consecutively inputted 61 times, the selection pattern of current source cells selected cycles back. That is, even if an input code "in" of either "2" through "63" is inputted successively, the selection pattern of the current source cells selected does not cycle back until it is inputted consecutively 61 times.

The features of the cell selection method in response to input codes "in" of a digital-to-analog converter so configured are described below.

(1) With the present embodiment, for a current output type digital-to-analog converter having 63 current source cells C01–C63, the 63 current source cells C01–C63 are classified into cyclically selected cells and noncyclically selected cells, and the cyclically selected cells are comprised of a prime number of, or 61, current source cells C02–C62. Thus, even if the same input code "in" is inputted successively, the selection pattern of current source cells selected does not cycle back until it is inputted consecutively 61 times. In other words, the number of selection patterns required to cycle back to the same selection pattern can be maximized to a prime number, or 61.

Thus, because there are 61 selection patterns, the noise can be distributed over many frequencies and its value can be reduced, and the output current due to manufacturing variations among current source cells can be averaged, thereby allowing for digital-to-analog conversion with a high degree of accuracy. As a result, highly accurate digital-to-analog conversion can be achieved with low-oversampling-rate digital-to-analog converters or Nyquist-rate digital-to-analog converters.

In addition, with a conventional high-oversampling-rate digital-to-analog converter, noise attenuation characteristics required for filter circuitry added at its output may be set less stringently, so that complexity of filter circuitry can be abated as a result.

(2) With the present embodiment, for a current output type digital-to-analog converter having 63 current source cells C01–C63, the 63 current source cells C01–C63 are classified into cyclically selected cells and non-cyclically selected cells, and the cyclically selected cells are comprised of a prime number of, or 61, current source cells C02–C62. Thus, it can be realized by just slightly modifying an existing digital-to-analog converter, instead of substantially changing its design, without the need for designing a new digital-to-analog converter.

(3) With the present embodiment, because the number of cyclically selected sells uses the greatest prime number, or 61, among prime numbers equal to or smaller than the number of all current source cells C01-C62, or 63, the number of selection patterns required to cycle back to the same selection pattern can be maximized; the noise can be distributed over many frequencies and its value can be reduced; and the output current due to manufacturing variations among current source cells can be averaged.

It should be appreciated that the embodiment of the present embodiment may be changed as follows. With the afore-described embodiment, 61 current source cells C02–C62 relative to the 63 current source cells C01–C63 are used as cyclically selected cells. The cyclically selected cells may also be comprised of a prime number smaller than 61, e.g., 59, 53, 47, 43, or the like, as long as the accuracy is not degraded considerably.

With the afore-described embodiment, there is only one set of cyclically selected cells, though there may be multiple sets of cyclically selected cells. Then, if the number of cyclically selected cells is a prime number, its benefit can be similarly anticipated. For example, 63 cells are divided into three blocks, i.e., a block of 17 DWA-applied cyclically selected cells, a block of 23 cells, and a block of 23 cells, and the number of selected cells obtained from the input code may be distributed nearly equally among those three blocks. Additionally, there may be a combination of two sets of 31 cyclically selected cells and one non-cyclically selected cell.

Although the afore-described embodiment is embodied in a 6-bit digital-to-analog converter having 63 current source cells, the number of current source cells may be comprised of a prime number greater than 63. For example, provide a 6-bit digital-to-analog converter having 67 current source cells, which is a prime number greater than 63 and closest to 63. In this case, all of the 67 current source cells that comprise the digital-to-analog converter are assigned to cyclically selected cells, with no non-cyclically selected cell. Because it is comprised of 67cells, or a prime number closest to 63, even if the same input code "in" is inputted successively, the number of selection patterns required to cycle back to the same selection pattern can be maximized, while minimizing the increase in circuit size. As a result, the noise can be distributed over many frequencies and its value can be reduced, and the output current due to manufacturing variations among current source cells can be averaged, thereby allowing for digital-to-analog conversion with a high degree of accuracy.

Although the afore-described embodiment is embodied in a 6-bit digital-to-analog converter, it may also be embodied in the cell selection method in response to input codes "in" of digital-to-analog converters of 4 bits, 8 bits, 16 bits, and other bits. In that case, a similar benefit to the afore-described embodiment can also be provided.

With the afore-described embodiment, the sequence of selecting 61 current source cells C02–C62 as cyclically selected cells is from left to right in FIG. 2, though they may be sequentially selected from right to left in FIG. 2.

Although the afore-described embodiment is embodied in a current output type digital-to-analog converter, it may also be embodied in a voltage output type digital-to-analog converter. For example, it may be applied to a digital-to-analog converter that uses a capacitor.

As described in detail above, according to the invention described in claims 1 through 3, the noise based on cyclicality of selection patterns can be distributed and its value can be reduced without being dependent upon codes inputted, and the analog value due to manufacturing variations among output cells can be averaged, thereby achieving digital-to-analog conversion with a high degree of accuracy.

What is claimed is:

1. In a current output type digital-to-analog converter having a plurality of current source cells, a method of selecting cells in response to an input code, the method comprising the steps of:

designating a first plurality of the current source cells as cyclically selected cells, wherein said first plurality comprises a prime number; and designating a second plurality of the current source cells as non-cyclically selected cells, wherein the second plurality comprises the plurality of current source cells less the first plurality of current source cells;

wherein the cyclically selected cells are selected using a data weighted averaging technique.

2. The method for selecting cells of claim 1, wherein said cyclically selected cells are selected based on a new input code and are selected sequentially from the previously selected cells, and said non-cyclically selected cells are selected in response to a predetermined input code.

3. The method for selecting cells of claim 1, wherein the number of said cyclically selected cells is the greatest prime number among prime numbers equal to or less than the plurality cells.

4. The method for selecting cells of claim 2, wherein the non-cyclically selected cells comprise the left-most cell and the right-most cell.

* * * * *